United States Patent
Hine et al.

(10) Patent No.: US 9,386,699 B2
(45) Date of Patent: Jul. 5, 2016

(54) MOUNTED STRUCTURE AND MANUFACTURING METHOD OF MOUNTED STRUCTURE

(75) Inventors: Kiyohiro Hine, Osaka (JP); Akio Furusawa, Osaka (JP); Masato Mori, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 521 days.

(21) Appl. No.: 13/995,208

(22) PCT Filed: Dec. 21, 2011

(86) PCT No.: PCT/JP2011/007171
§ 371 (c)(1), (2), (4) Date: Jun. 18, 2013

(87) PCT Pub. No.: WO2012/086201
PCT Pub. Date: Jun. 28, 2012

(65) Prior Publication Data
US 2013/0277098 A1    Oct. 24, 2013

(30) Foreign Application Priority Data
Dec. 22, 2010    (JP) ................. 2010-285859

(51) Int. Cl.
| H05K 1/18 | (2006.01) |
| H05K 3/34 | (2006.01) |
| B23K 1/19 | (2006.01) |
| B23K 35/02 | (2006.01) |
| B23K 35/26 | (2006.01) |
| C22C 13/00 | (2006.01) |
| H05K 13/04 | (2006.01) |
| B23K 35/24 | (2006.01) |

(52) U.S. Cl.
CPC ........ *H05K 1/181* (2013.01); *B23K 1/19* (2013.01); *B23K 35/0261* (2013.01); *B23K 35/24* (2013.01); *B23K 35/262* (2013.01); *C22C 13/00* (2013.01); *H05K 3/3442* (2013.01); *H05K 13/0465* (2013.01); *H05K 3/3452* (2013.01);
(Continued)

(58) Field of Classification Search
CPC .................... H05K 1/181; H05K 3/3484
See application file for complete search history.

(56) References Cited

U.S. PATENT DOCUMENTS

| 5,551,627 A | 9/1996 | Leicht et al. |
| 2003/0121959 A1 | 7/2003 | Yamaguchi et al. |

(Continued)

FOREIGN PATENT DOCUMENTS

| CN | 1430465 A | 7/2003 |
| JP | 08-116169 A | 5/1996 |

(Continued)

OTHER PUBLICATIONS

Chinese language Office Action for Application No. 201180060594.X dated Jun. 2, 2015.
(Continued)

*Primary Examiner* — Jeremy C Norris
(74) *Attorney, Agent, or Firm* — RatnerPrestia

(57) ABSTRACT

The present invention has an aspect to provide a mounted structure of which heat-resistant fatigue characteristic is improved. A mounted structure is provided with a substrate having a substrate electrode, an electronic component having a component electrode, and a bonding part bonding the substrate electrode and the component electrode, wherein the bonding part is constituted by a solder reinforcing part and a solder bonding part, the solder reinforcing part is a side vicinity part of the bonding part, and is constituted by In of 3 wt % or more and 8 wt % or less and Sn of 88 wt % or more, and the solder bonding part is constituted by a Sn—Bi system solder material and In of 0 wt % or more and less than 3 wt %.

7 Claims, 15 Drawing Sheets

(52) U.S. Cl.
CPC .......... *H05K 3/3463* (2013.01); *H05K 3/3484* (2013.01); *H05K 2201/099* (2013.01); *H05K 2201/0989* (2013.01); *H05K 2201/10636* (2013.01); *H05K 2203/1476* (2013.01)

(56) References Cited

U.S. PATENT DOCUMENTS

| | | |
|---|---|---|
| 2004/0253474 A1 | 12/2004 | Akamatsu et al. |
| 2007/0175969 A1 | 8/2007 | Wada et al. |
| 2009/0233117 A1 | 9/2009 | Sakai et al. |

FOREIGN PATENT DOCUMENTS

| | | |
|---|---|---|
| JP | 2005-005570 A | 1/2005 |
| JP | 2006-186011 A | 7/2006 |
| JP | 2006-332354 A | 12/2006 |

OTHER PUBLICATIONS

The State Intellectual Property Office of the People's Republic of China Search Report for Application No. 201180060594.X.

International Search Report for Application No. PCT/JP2011/007171, dated Apr. 3, 2012.

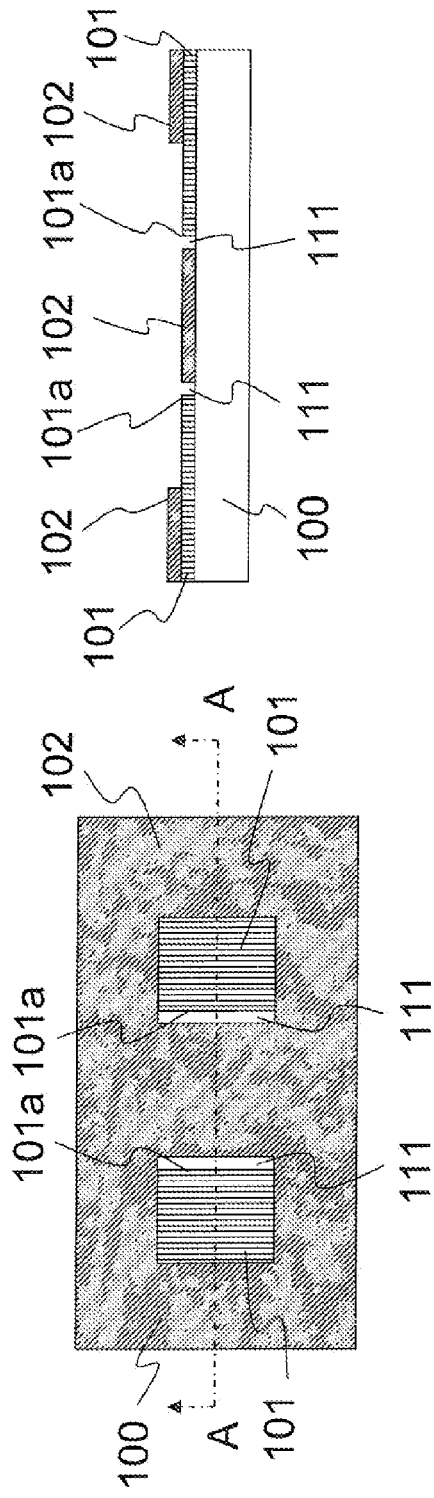
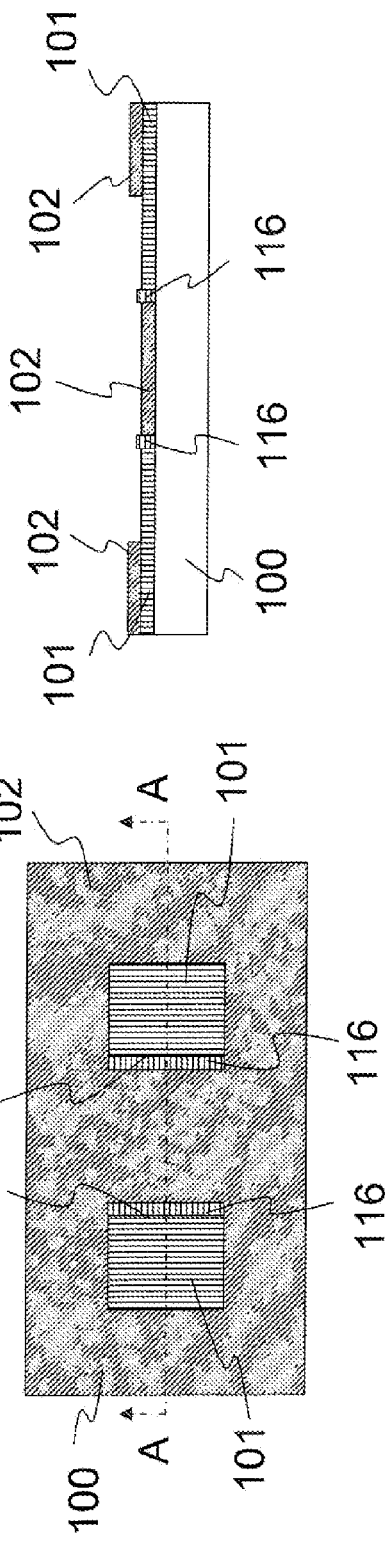

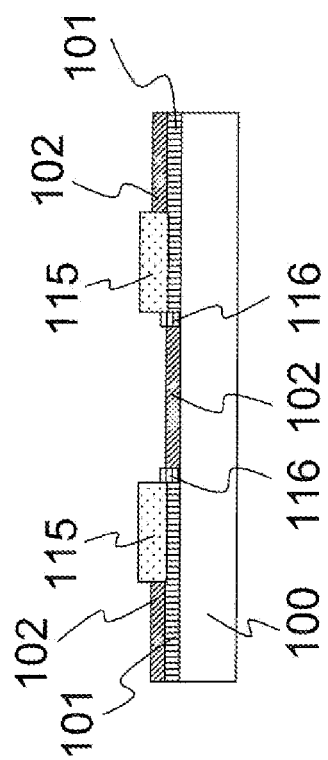
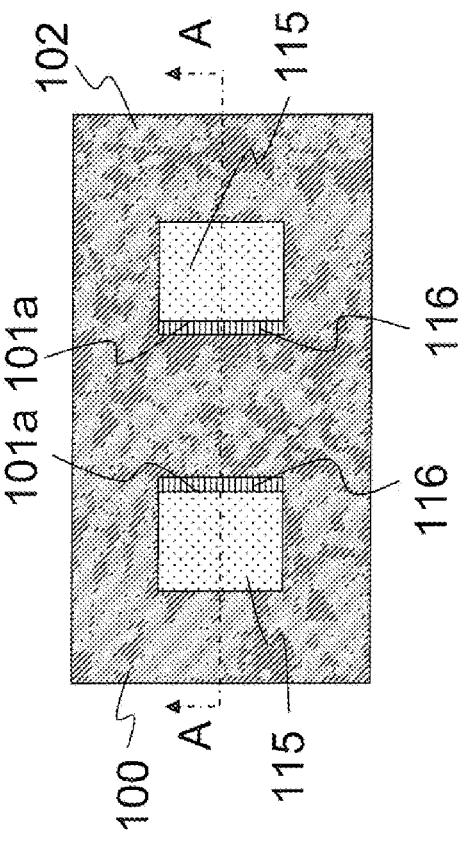
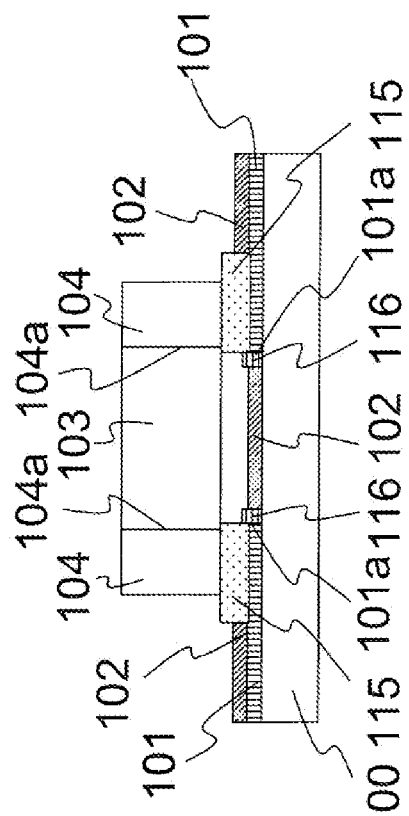
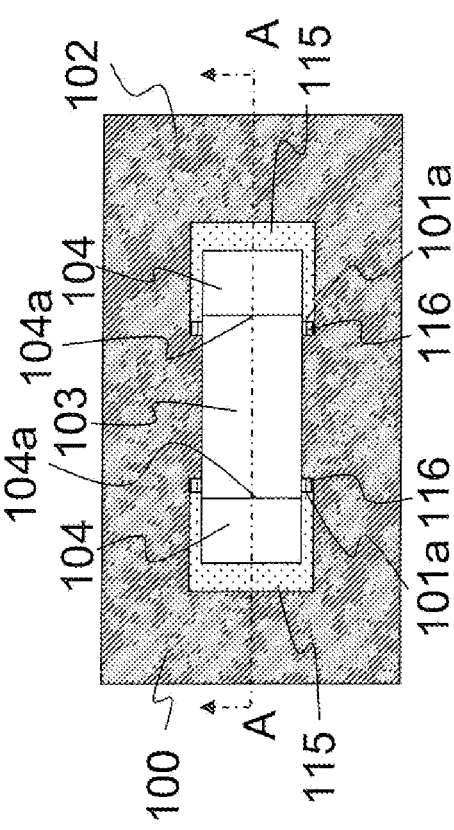

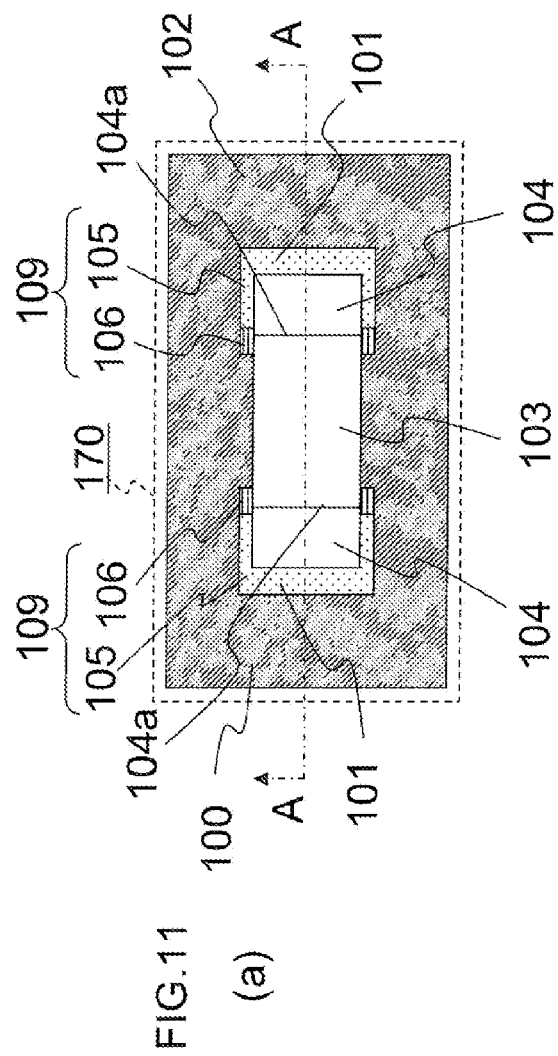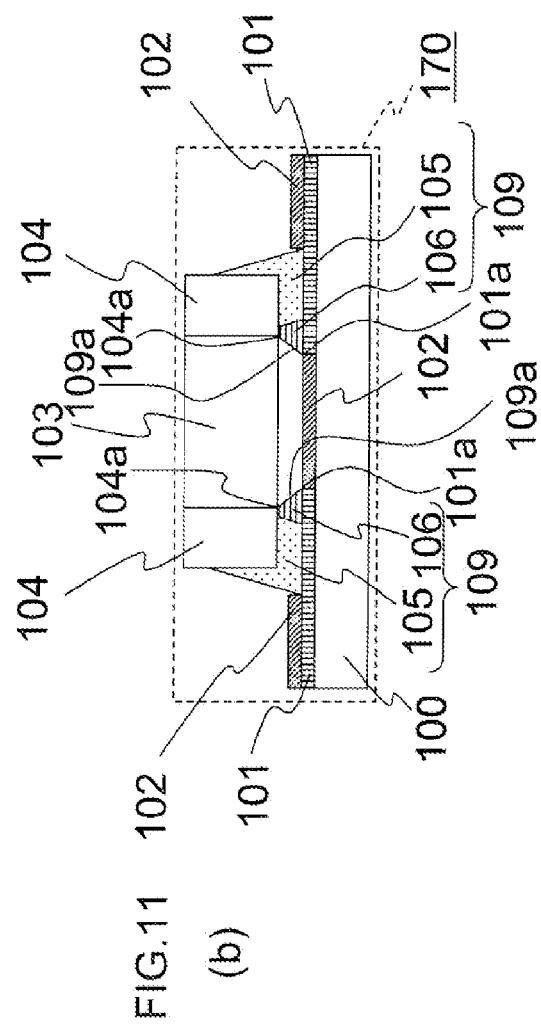
FIG.11 (a)
FIG.11 (b)

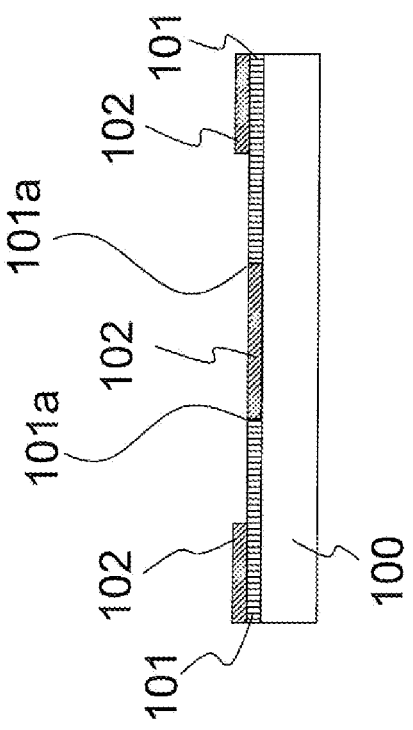
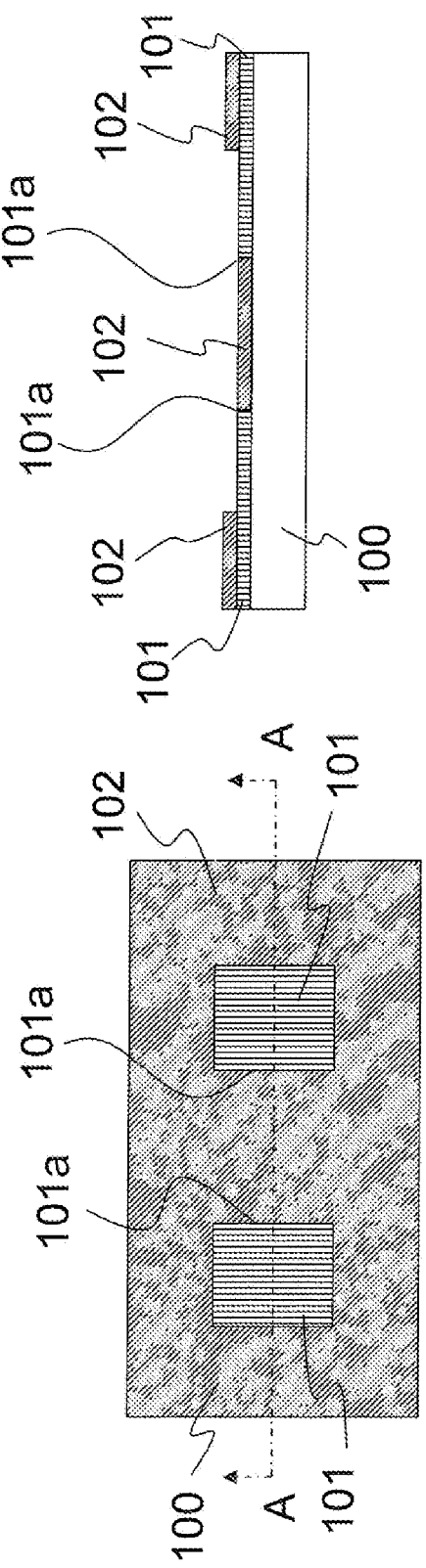
FIG.12 (a)
FIG.12 (b)

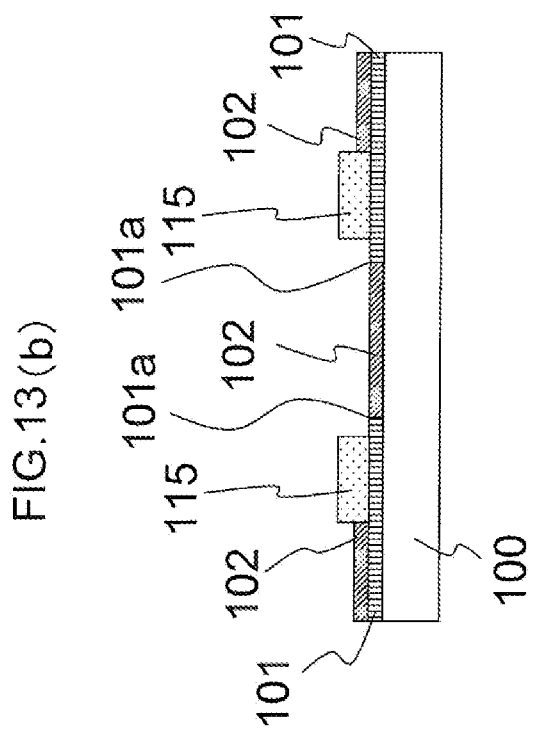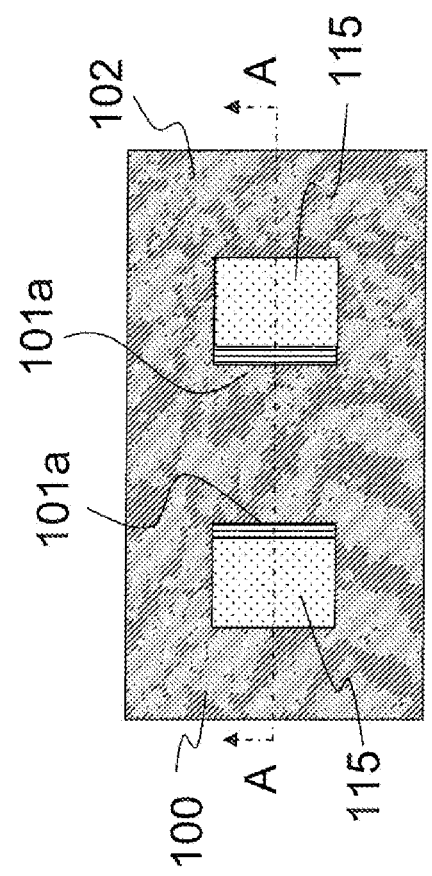

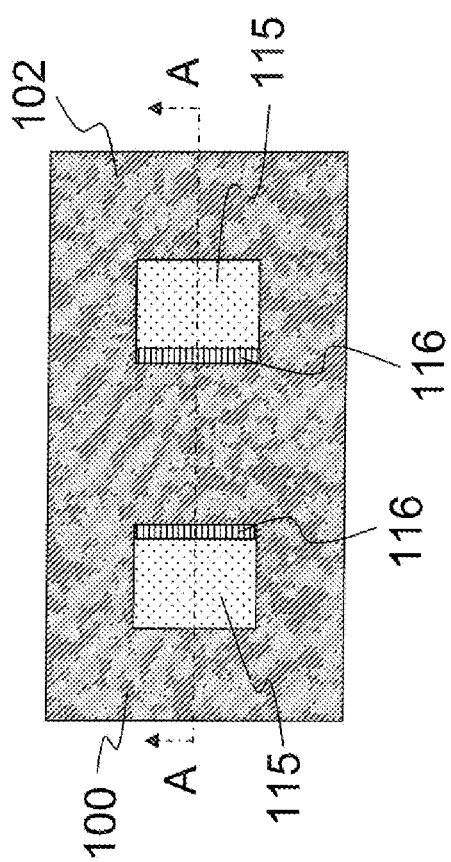
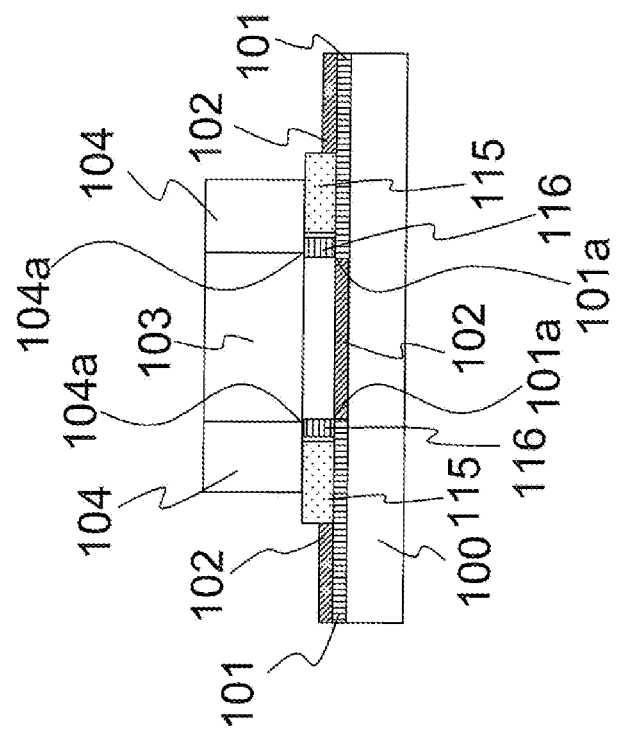
FIG.15 (a)
FIG.15 (b)

MOUNTED STRUCTURE AND MANUFACTURING METHOD OF MOUNTED STRUCTURE

CROSS-REFERENCE TO RELATED APPLICATIONS

This application is a U.S. national phase application of PCT International Patent Application No. PCT/JP2011/007171 filed Dec. 21, 2011, claiming the benefit of priority of Japanese Patent Application No. 2010-285859 filed Dec. 22, 2010, all of which are incorporated by reference herein in their entirety.

FIELD OF THE INVENTION

The present invention relates to a mounted structure and a manufacturing method of the mounted structure, and particularly, relates to a mounted structure and a manufacturing method of the mounted structure by using Surface Mount Technology (hereinafter, will be simply referred to as SMT).

BACKGROUND OF THE INVENTION

The mounted structure is manufactured by following a series of SMT processes.

At first, solder paste which is constituted by spherical solid metal solder and liquid flux is applied with mask print on a substrate electrode which is provided on a surface of a substrate. Then, an electronic part such as a tip condenser or an IC having an electronic part electrode is mounted on the solder paste. And solder contained in the solder paste is melted by heating up to a temperature that is higher than the melting point of the solder by 20° C. to 30° C. At the end, the solder is solidified by cooling, and electrical connection of the substrate electrode and the electronic part electrode is carried out.

Since the solder is heated in the case of such an SMT process, the electronic components and the substrate are heated to the temperature that is higher than the melting point of the solder by 20° C. to 30° C. Therefore, by using the Sn-58Bi solder with the melting point of 138° C., electric components which have low heat resistance can be mounted on the substrate by low-temperature heating at 160° C. or less with SMT.

However a metal structure of the Sn-58Bi solder is a eutectic structure of Sn and Bi, and Bi is poor in ductility. Therefore a crack occurs on an interface of Sn and Bi when a shock or vibration is added.

In addition, a good heat-resistant fatigue characteristic is not acquired, because metal crystals of the Sn-58Bi solder alloy become a fault size easily by heat and the strength of a solder bonding part decreases. Therefore a crack due to repetition of the heat fatigue is easy to occur. Because an electrical problem and a mechanical problem occur when a crack occurs and progresses, it is necessary to restrain an occurrence of the crack.

As a conventional mounted structure, a mounted structure in which junction reliability is improved by using Sn-58Bi solder and by reinforcing with resin or the like is disclosed (for example, refer to Japanese Patent Laid-Open No. 2006-186011).

FIG. 17 is a figure showing a conventional mounted structure mentioned in Japanese Patent Laid-Open No. 2006-186011.

The conventional mounted structure has a solder bonding part 205 using Sn-58Bi solder, which bonds between a component electrode 204 of an electric component 203 and a substrate electrode 201 of a substrate 200, a first adhesion reinforcing part 206 using a thermosetting resin, which is formed outside of the electric component 203 and the solder bonding part 205, a solder part 208 using Sn-58Bi solder, a second adhesion reinforcing part 207 using a thermosetting resin of which an essential agent is an epoxy-system materials, and resist 202.

SUMMARY OF THE INVENTION

Problems to be Solved by the Invention

The above mentioned conventional constitution can suppress the occurrence of crack which is generated by a shock or a vibration. However, since the first adhesion reinforcement part 206 and the second adhesion reinforcement part 207 are surrounding the solder bonding part 205 using Sn-58Bi solder, when heat is added, a good heat-resistant fatigue characteristic is not acquired due to the stress applied to the solder bonding part 205 by the difference among each coefficient of linear expansion of the first adhesion reinforcing part 206, the second adhesion reinforcing part 207, and the solder bonding part 205.

The present invention has an aspect to provide a mounted structure of which heat-resistant fatigue characteristic is improved, and a method for manufacturing the same to solve a conventional problem mentioned above.

SUMMARY OF THE INVENTION

To solve the above object, the $1^{st}$ aspect of the present invention is a mounted structure comprising:

a substrate having a substrate electrode;

an electronic component having a component electrode; and a bonding part bonding the substrate electrode and the component electrode, wherein the bonding part is constituted by a solder reinforcing part and a solder bonding part;

the solder reinforcing part is a side vicinity part of the bonding part, and is constituted by In of 3 wt % or more and 8 wt % or less and Sn of 88 wt % or more, and the solder bonding part is constituted by a Sn—Bi system solder material and In of 0 wt % or more and less than 3 wt %.

The $3^{rd}$ aspect of the present invention is the mounted structure according to the $1^{st}$ aspect of the present invention, wherein the solder reinforcing part is formed by a thickness of 10 μm or more and 0.27 mm or less with reference to direction from the side surface to an inner part.

The $4^{th}$ aspect of the present invention is a manufacturing method of a mounted structure comprising:

supplying a first solder material on a substrate electrode of a substrate or to a neighborhood of the substrate electrode;

supplying a second solder material on the substrate electrode;

disposing a component electrode of an electronic component on the second solder material to mount the electronic component on the substrate;

heating the first solder material and the second solder material at a temperature of a melting point of the second solder material or more and less than a melting point of the first solder material; and cooling the first solder material and the second solder material after the heating, wherein the first solder material and the second solder material are mutually close due to the supplying of the first solder material and the second solder material, the second solder material is a Sn—Bi system solder material that does not contain In, the first solder material is a material that contains In of 3 wt % or more and 8 wt % or less and Sn of 88 wt % or more, In of the first solder material fuses into the second solder material which has been melted by the heating, and then, when a bonding part, which bonds between the substrate electrode and the component electrode, is formed by the cooling, i) a part included in the bonding part, into which In fuses and is constituted by In of 3 wt % or more and 8 wt % or less and Sn of 88 wt % or more, is formed on a side vicinity part of the bonding part as a solder reinforcing part, and ii) a part, which is included in the bonding part except for the solder reinforcing part and is constituted by a Sn—Bi system solder material and In of 0 wt % or more and less than 3 wt %, is formed as a solder bonding part.

The 5$^{th}$ aspect of the present invention is the manufacturing method of a mounted structure according to the 4$^{th}$ aspect of the present invention, wherein the substrate has a pair of the substrate electrodes, the electronic component has a pair of the component electrodes, the bonding parts are formed between the pair of the substrate electrodes and the pair of the component electrodes which are corresponding to the pair of the substrate electrodes, respectively, and the solder reinforcing parts are formed on whole side surfaces of the bonding parts respectively, the side surfaces facing each other.

The 6$^{th}$ aspect of the present invention is the manufacturing method of a mounted structure according to the 4$^{th}$ aspect of the present invention, wherein the solder reinforcing part is formed by a thickness of 10 μm or more and 0.27 mm or less with reference to direction from the side surface to an inner part.

The 7$^{th}$ aspect of the present invention is the manufacturing method of a mounted structure according to the 4$^{th}$ aspect of the present invention, wherein the first solder material is a Sn—Ag—Bi—In system solder material.

The 8$^{th}$ aspect of the present invention is a manufacturing method of a mounted structure comprising:

supplying Sn-3.5Ag-0.5Bi-6In as a first solder material on a substrate electrode of a substrate or to a neighborhood of the substrate electrode;

supplying Sn-58Bi as a second solder material on the substrate electrode;

disposing a component electrode of an electronic component on the second solder material to mount the electronic component on the substrate;

heating the first solder material and the second solder material at a temperature of a melting point of the second solder material or more and less than a melting point of the first solder material; and cooling the first solder material and the second solder material after the heating, wherein the first solder material and the second solder material are mutually close due to the supplying of the first solder material and the second solder material, In of the first solder material fuses into the second solder material which has been melted by the heating, and then, when a bonding part, which performs bond between the substrate electrode and the component electrode, is formed by the cooling, i) a part included in the bonding part, into which In fuses and is constituted by In of 3 wt % or more and 8 wt % or less and Sn of 88 wt % or more, is formed on a side vicinity part of the bonding part as a solder reinforcing part, and ii) a part, which is included in the bonding part except for the solder reinforcing part and is constituted by a Sn—Bi system solder material and In of 0 wt % or more and less than 3 wt %, is formed as a solder bonding part.

Advantageous Effects of the Invention

According to the present invention, providing the mounted structure of which heat-resistant fatigue characteristic is improved, and a manufacturing method of the mounted structure is enabled.

BRIEF DESCRIPTION OF THE DRAWINGS

FIG. 4(a) is a view for describing a manufacturing method of a mounted structure according to Embodiment 1 of the present invention;

FIG. 4(b) is a sectional schematic view illustrating a cross section between A and A in FIG. 4(a);

FIG. 5(a) is a view for describing a manufacturing method of a mounted structure according to Embodiment 1 of the present invention;

FIG. 5(b) is a sectional schematic view illustrating a cross section between A and A in FIG. 5(a);

FIG. 6(a) is a view for describing a manufacturing method of a mounted structure according to Embodiment 1 of the present invention;

FIG. 6(b) is a sectional schematic view illustrating a cross section between A and A in FIG. 6(a);

FIG. 7(a) is a view for describing a manufacturing method of a mounted structure according to Embodiment 1 of the present invention;

FIG. 7(b) is a sectional schematic view illustrating a cross section between A and A in FIG. 7(a);

FIG. 11(a) is a planar schematic view illustrating a mounted structure according to Embodiment 4 of the present invention;

FIG. 11(b) is a sectional schematic view illustrating a cross section between A and A in FIG. 11(a);

FIG. 12(a) is a view for describing a manufacturing method of a mounted structure according to Embodiment 4 of the present invention;

FIG. 12(b) is a sectional schematic view illustrating a cross section between A and A in FIG. 12(a);

FIG. 13(a) is a view for describing a manufacturing method of a mounted structure according to Embodiment 4 of the present invention;

FIG. 13(b) is a sectional schematic view illustrating a cross section between A and A in FIG. 13(a);

FIG. 15(a) is a view for describing a manufacturing method of a mounted structure according to Embodiment 4 of the present invention;

FIG. 15(b) is a sectional schematic view illustrating a cross section between A and A in FIG. 15(a);

DESCRIPTION OF PREFERRED EMBODIMENTS

Figure 1:
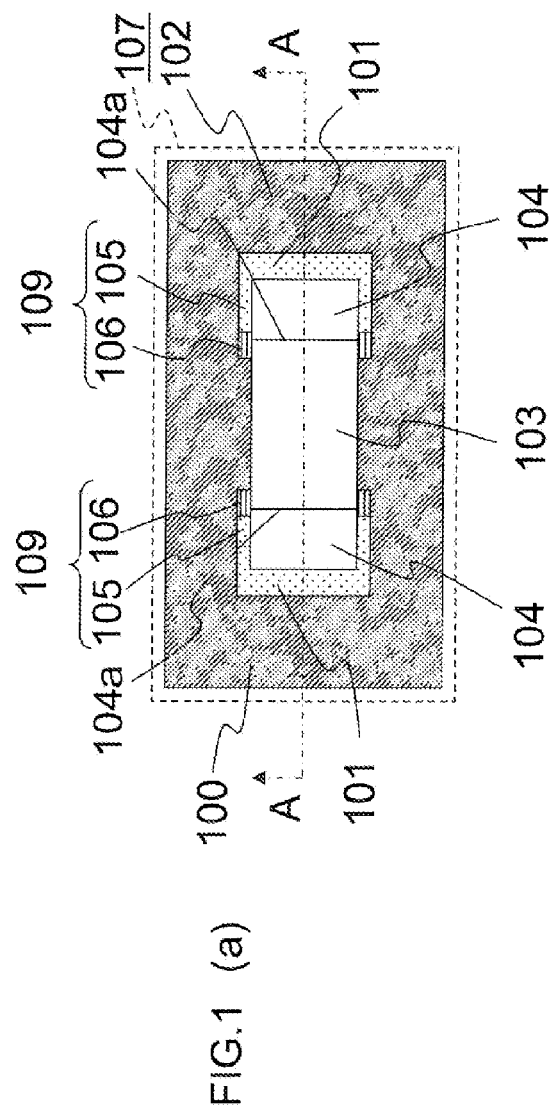
FIG. 1(a) is a planar schematic view illustrating a mounted structure according to Embodiment 1 of the present invention.
FIG. 1(b) is a sectional schematic view illustrating a cross section between A and A in FIG. 1(a)
Figure 1:
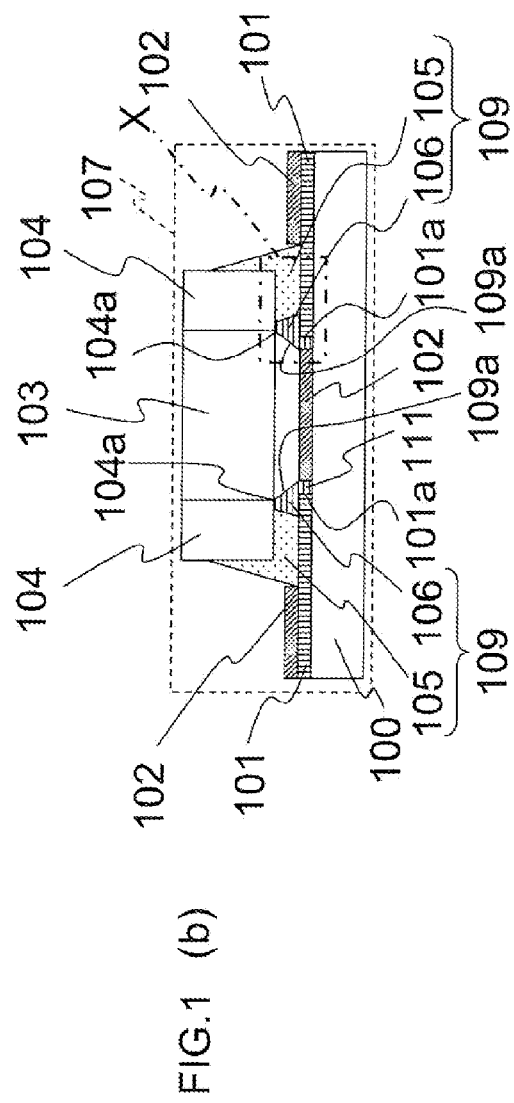

In the following, embodiments of the present invention will be described, referring to the drawings.

Embodiment 1

Hereinafter, a mounted structure according to Embodiment 1 of the present invention will be described.

Figure 2:
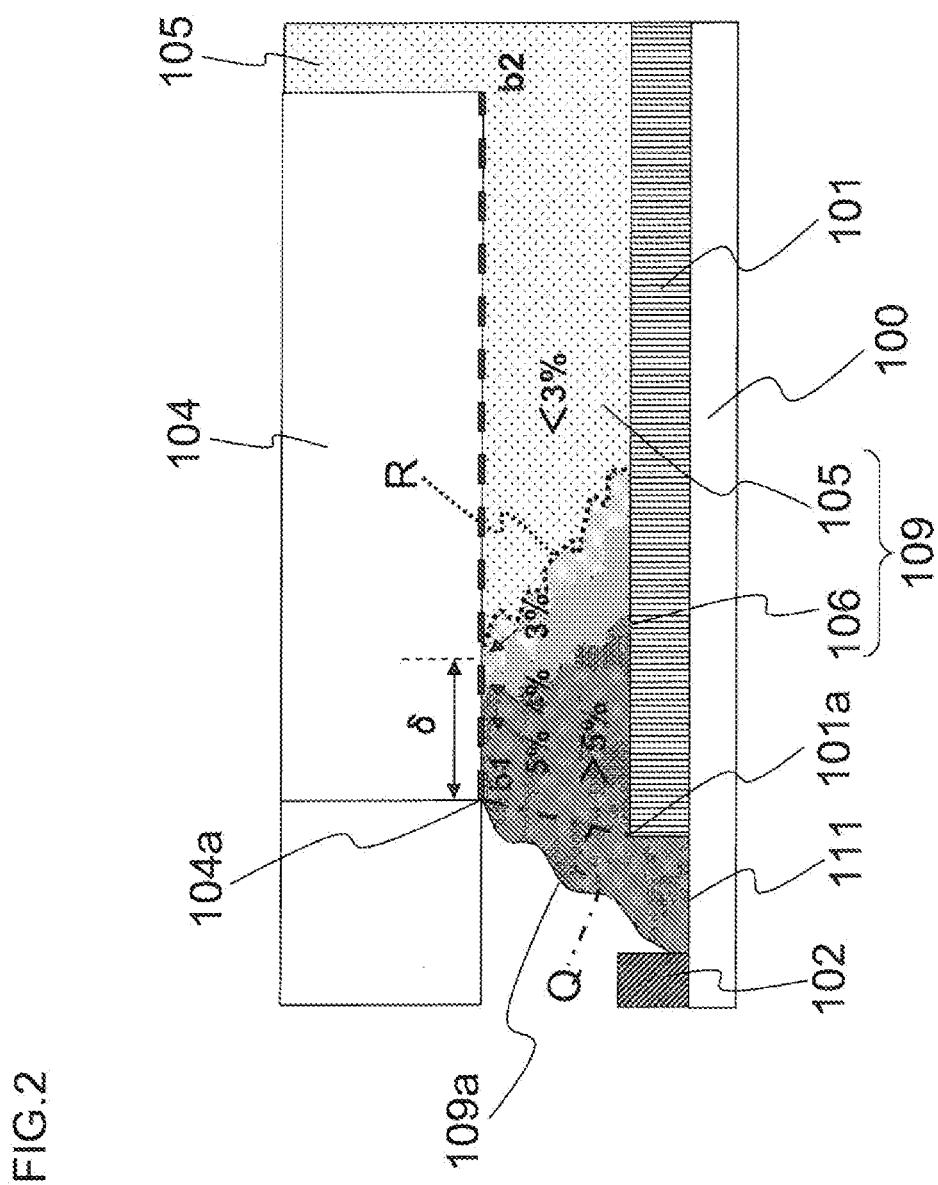
FIG. 2 is an extended schematic view for describing a forming state in which a solder bonding part and a solder reinforcing part are formed in a bonding part of X of FIG. 1(b)
Figure 3:
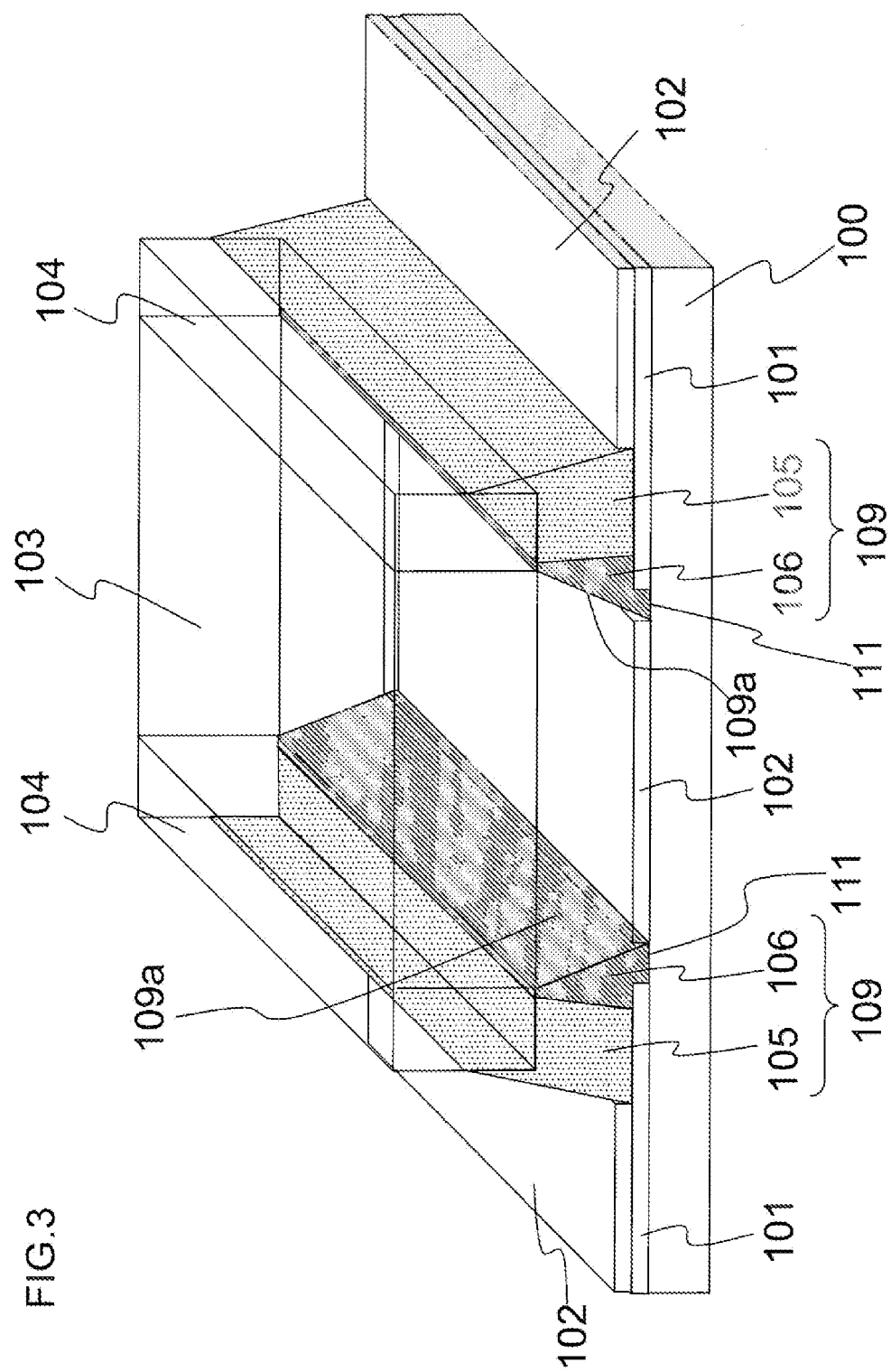
FIG. 3 is a perspective schematic view illustrating a mounted structure according to Embodiment 1 of the present invention.
Figure 8:
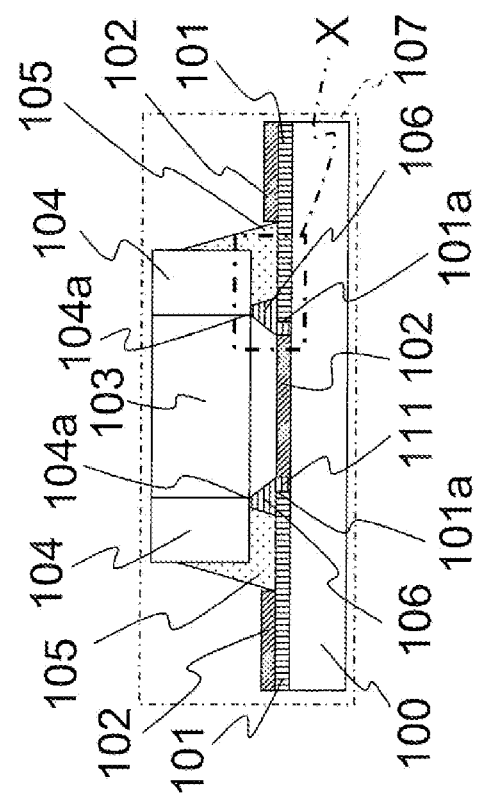
FIG. 8(a) is a view for describing a manufacturing method of a mounted structure according to Embodiment 1 of the present invention.
FIG. 8(b) is a sectional schematic view illustrating a cross section between A and A in FIG. 8(a)
Figure 8:
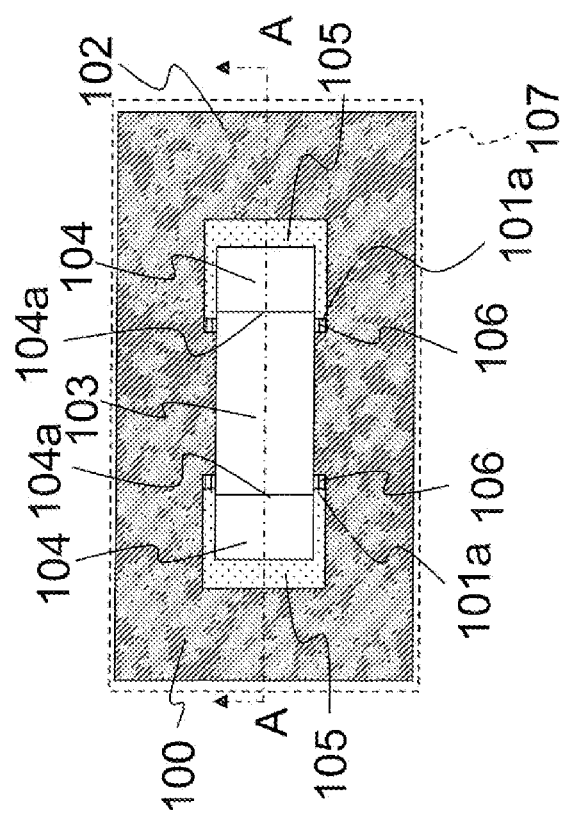

FIG. 1(a) is a planar schematic view illustrating a mounted structure according to Embodiment 1 of the present invention. FIG. 1(b) is a view illustrating a sectional schematic view illustrating a cross section between A and A in FIG. 1(a). FIG. 2 is an extended schematic view for describing a forming state in which a solder bonding part 105 and a solder reinforcing part 106 are formed in a bonding part of X of FIG. 1(b). FIG. 3 is a perspective schematic view illustrating a mounted structure according to Embodiment 1 of the present invention;

As shown in FIGS. 1(a) and 1(b), a mounted structure 107 of Embodiment 1 is provided with a substrate 100 which has a substrate electrode 101 and resist 102, an electric component 103 which is mounted on the substrate 100 and has a component electrode 104, and a bonding part 109 which bonds the component electrode 104 to the substrate electrode 101.

The bonding part 109 has a solder bonding part 105 and a solder reinforcing part 106. The solder reinforcing part 106 is a part formed in the whole surface 109a where two bonding parts 109 face each other, and the solder bonding part 105 is a part other than the solder reinforcing part 106 of the bonding part 109.

Moreover, as shown FIG. 2, in the present embodiment, the solder reinforcing part 106 denotes from a portion shown a face R (refer to dotted line in FIG. 2) to the surface 109a of the bonding part 109 through the plane Q (refer to alternate long and short dash line in FIG. 2) which connects between a substrate electrode edge 101a and a component electrode edge part 104a. As shown in FIG. 1(b) and FIG. 2, this substrate electrode edge 101a denotes an inside edge of the substrate electrode 101 with reference to the electronic component 103 that has been mounted. In addition, the component electrode edge part 104a denotes an inside edge of the component substrate 104 with reference to the electronic component 103 that has been mounted. And the solder reinforcing part 106 is formed in the whole surface 109a of the inside of the bonding part 109, which is each surface side where the bonding parts 109 face each other. A clearance 111 is formed between the resist 102 placed below the electric component 103 and the substrate electrode 101.

Next, a manufacturing method of the mounted structure 107 according Embodiment 1 will be described.

FIGS. 4 to 8 are views for describing each process of a manufacturing method of a mounted structure according to Embodiment 1. Incidentally, in (a) of each one of FIGS. 4 to 8, a planar schematic view is shown, and in (b) of each one of FIGS. 4 to 8, a sectional schematic view illustrating a cross section between A and A in the planar schematic view is shown. In FIGS. 4 to 8, the same symbols are used to denote constituent elements that are the same as in FIG. 1 and explanations of the same symbols are omitted.

As shown FIGS. 4(a) and 4(b), on the surface of the substrate 100, clearance 111 with a dimension of 0.3 mm is formed between the resist 102 disposed below the position on which the electric component 103 will be mounted, and the substrate electrode edges 101a.

Next, as shown FIGS. 5(a) and 5(b), a paste-like first solder material 116 is supplied to the clearance 111 by screen-printing using a metal mask with a thickness of 30 μm. The alloy composition of the first solder material 116 used in Embodiment 1 is Sn-3.5Ag-0.5Bi-6.0In. A melting point thereof is 209° C. at liquidus temperature, and a viscosity thereof is about 200 Pa·s.

Next, as shown FIGS. 6(a) and 6(b), a paste-like second solder material 115 is supplied on the substrate electrode 101 by using a metal mask with a thickness of 120 μm. In this case, the second solder material 115 of quantity with a width of 2.7 mm is supplied in the width direction (that is, the same direction as the width direction of the clearance). The alloy composition of the second solder material 115 used in Embodiment 1 is Sn-58Bi. A melting point thereof is 139° C., and a viscosity thereof is about 200 Pa·s.

As shown FIGS. 7(a) and 7(b), the component electrode 104 of the electronic component 103 is disposed on the second solder material 115 and the electronic component 103 is mounted. The electronic component 103 mounted is a tip condenser with 3216 size.

Next, heating of the first solder material 116 and the second solder material 115 is performed on the general bonding condition of the Sn-58Bi solder so that the maximum temperature becomes the melting point of the second solder material 115 or more and less than the melting point of the first solder material 116. By this heating, the second solder material 115 melts, however, the first solder material 116 does not melt. However, In of the first solder material 116 fuses into the second solder material 115 which has melted. What the fusion of In is mentioned later further.

Here, a predetermined part which is contained in the part where the first solder material 116 fuses into the second solder material 115 which has melted is called the solder reinforcing part 106, and the other part is called the solder bonding part 105.

By cooling afterwards, the component electrode 104 and the substrate electrode 101 are bonded by the solder bonding part 105 and the solder reinforcing part 106, and the mounted structure 107 shown in FIGS. 8A and 8B is manufactured.

In addition, as a concrete heating condition, the maximum temperature is set to 160° C. and the period of time when the temperature is maintained at 140° C. or more is set with 30 s.

In detail, the total time when the period of time to rise the temperature from 140° C. to 160° C. and the period of time to lower the temperature from 160° C. to 140° C. are added up is set to 30 s.

A heat fatigue examination is performed by using the mounted structure 107 of Embodiment 1 which is manufactured by the above-mentioned process. 500 cycles are performed under the condition of the heat fatigue examination, which is to keep −40° C. for 30 min and 85° C. for 30 min as 1 cycle.

The occurrence of the crack is not observed when the section of the dashed line AA part in FIG. 1(*a*) is observed after the heat fatigue examination.

Then, a heat fatigue examination is performed using a mounted structure, which does not have the solder reinforcing part 106, for a comparison. 500 cycles are performed under the condition of the heat fatigue examination, which is to keep 40° C. for 30 min and 85° C. for 30 min as 1 cycle like the above.

Table 1 shows whether the crack exists or not when the section of the dashed line AA part of FIG. 1(*a*) is observed after the heat fatigue examination.

TABLE 1

| existence of solder reinforcing part | not exist | exist |
|---|---|---|
| occurrence state of crack | occur | not occur |

As shown in Table 1, the crack occurs in the mounted structure which is not provided with the solder reinforcing part 106.

From this result, it is seen that the solder reinforcing part 106 is formed by supplying the first solder material 116 and the occurrence of the crack in the solder bonding part 105 due to the heat fatigue is suppressed by the solder reinforcing part 106, and a heat resistance fatigue characteristic of the mounted structure 107 can be improved.

In this embodiment, since it is thought that In which is contained in the solder reinforcing part 106 has a big influence on heat-resistant fatigue characteristic of a mounted structure, about In content of solder reinforcing part 106, inspection is performed below.

In this embodiment, In which is contained in the first solder material 116 fuses into the second solder material 115, which has melted, in the heating step and is diffused in the second solder material 115. Therefore it is thought that the In content rate becomes large as the position becomes closer to the clearance 111 to which the first solder material 116 is supplied, and the In content rate becomes slightly small as the position is separated from the clearance 111. In other words, between the substrate electrode 101 and the component electrode 104, it is thought that as the position becomes nearer to the substrate electrode 101, the In content rate at the position becomes slightly large and as the position becomes nearer to the component electrode 104, the In content rate at the position becomes slightly small. In addition, In content rate is the result of performing ultimate analysis of the range of the diameter of 20 μm including the point of measurement using energy dispersion type X-rays analysis (EDX).

In addition, when In content rate is compared in the part (refer to b1-b2 part in FIG. 2) which is located just under the component electrode 104, there is the most In content rate at the component electrode edge part 104*a* which is near to the clearance 111, and the In content becomes small as separated from clearance 111.

Figure 9:
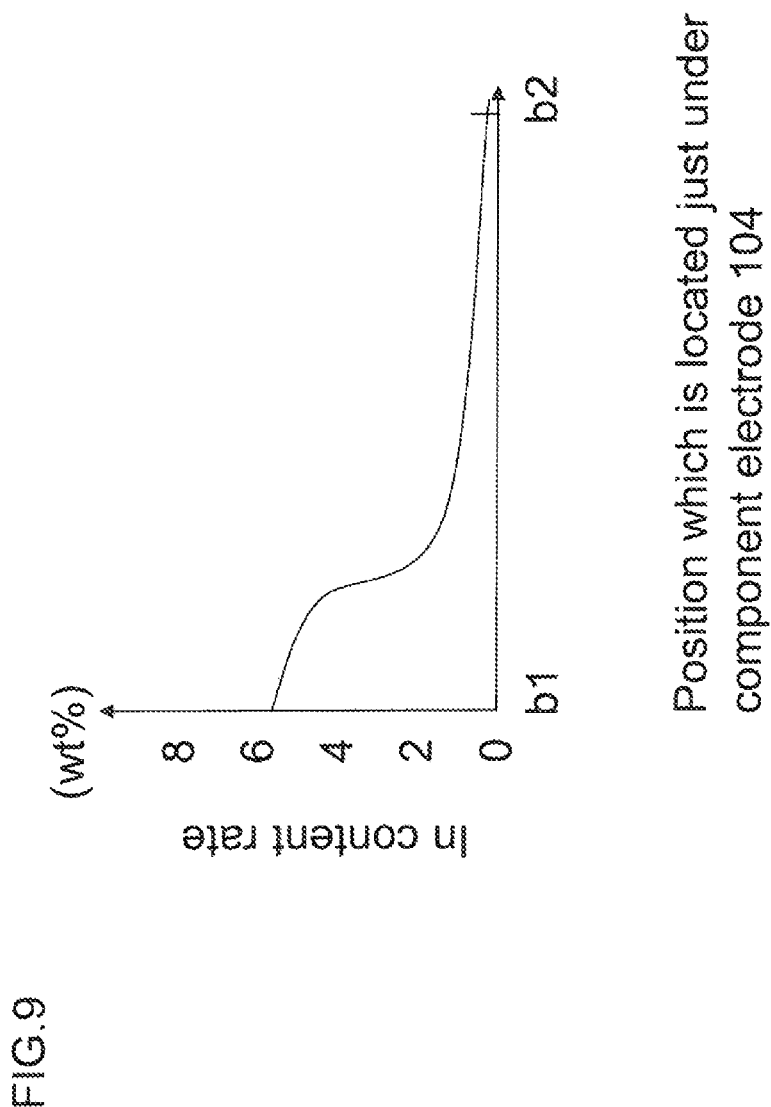
FIG. 9 is a view illustrating In content rate in b1-b2 part in FIG. 2.

FIG. 9 is the figure showing the measurement result of the In content rate at the part, which is shown with dashed line b1-b2 and which is right under the component electrode 104 that is bonded to the substrate electrode 100 by the solder bonding part 105 and the solder reinforcing part 106 of FIG. 2.

As shown in FIG. 9, the In content rate in the bonding part 109 is distributed with the value which is different according to a place. Namely, the In content rate in the component electrode edge part 104*a* (b1 part) which is the position that is the nearest to the clearance 111 in the component electrode 104 is 6 wt % same as the In content rate of the first solder material 116 supplied to clearance 111. And the In content rate decreases as separated from the clearance 111 and the In content rate becomes less than 1 wt % at the position of b2.

In addition, since the distance (the height) (for example, 0.05 mm) from the substrate 100 to the bottom surface of the electronic component 103 is small as compared with the width (for example, 0.3 mm) of the clearance 111, the change of the concentration of In content rate hardly occurs in this height direction. Therefore, as described above, the In content rate in the component electrode edge part 104*a* (b1 part) becomes almost the same as the In content rate of the first solder material 116 supplied to clearance 111. By the way, the length in the height direction is exaggerated in comparison with the lateral length in FIG. 2 in the figures of this application for understanding easily.

From this result, it is confirmed that In which is contained in the supplied first solder material 116 exists a lot in the vicinity of the component electrode edge part 104*a* which is near the supplied clearance 111 in b1-b2 part and it is confirmed that the solder reinforcing part 106 containing In is formed to the surface 109*a* through the plane Q between the substrate electrode edge 101*a* and the component electrode edge part 104*a*.

By the way, in this specification, the solder reinforcing part 106 is defined as a part where In content rate is 3 wt % or more and 8 wt % or less, and where Sn content rate is 88 wt % or more. In addition, the solder bonding part 105 is defined as part which contains solder material of Sn—Bi system and In of 0 wt % or more and less than 3 wt %.

Since In is formed to the whole surface 109*a* like this, the strength of the entirety of the surface 109*a* is improved by In solid-solution-strengthen. Therefore the occurrence of the crack of the solder bonding part 105 due to the heat fatigue, which is a problem when an electric component is bonded to a substrate by a Sn—Bi system solder, is suppressed and the heat-resistant fatigue characteristic of the mounted structure is able to be improved.

In addition, since the difference of a coefficient of linear expansion between the solder bonding part 105 and the solder reinforcing part 106 is small as compared with the conventional case where the solder bonding part 205 is being surrounded by resin, the heat-resistant fatigue characteristic can be improved, even when it is compared with the conventional structure.

Here, the fusion of In is described furthermore. That is, in the present embodiment, the second solder material 115 is melted by heating at the temperature that is higher than the melting point of the second solder material 115 and less than the melting point of the first solder material 116, however, the first solder material 116 does not melt except for the melting of the paste ingredient. However, the metal particles which are contained in the first solder material 116 are diffused into the second solder material 115 that has already melted, and In which is contained in metal particles fuses into the second solder material 115 side. Since the speed, at which In fuses into the second solder material 115 side by setting up the heating temperature as mentioned above, becomes slow, the solder reinforcing part 106, which contains In of 3 wt % or more, can be formed in the part which contains the surface 109a and is near the position where the first solder material 116 is supplied. If the heating is performed at the melting point of the first solder material 116 or more, the speed, at which In fuses into, is quick, therefore In is diffused broadly and concentration becomes low too much. As a result, the solder reinforcing part 106 which fulfills the conditions that In content rate is 3 wt % or more may not be formed.

Embodiment 2

In Embodiment 2 of the present invention, a mounted structure 107, which is formed by changing In content of the first solder material 116 in the mounted structure according to Embodiment 1, will be described. The other constitution and the manufacturing method are similar to Embodiment 1.

The alloy composition of the first solder material 116 which is used here is changed into Sn-3.5Ag-0.5Bi-xIn (0x<=9) and the In content rate of the solder which contacted with the position of b1 in FIG. 2 is measured.

As a result, even when the first solder material 116 having any kind of In content rate is supplied, it is confirmed that the In of the first solder material 116 diffuses to the position of b1 in FIG. 2 and the In content rate in the position of b1 of the bonding part 109 becomes equivalent to the In content rate of the first solder material 116 that is supplied. This is because the change of the concentration of the In content rate hardly occurs in the height direction as described above. That is to say, in case where the first solder material which has, for example, In content rate of 4 wt % is supplied, In content rate in the position of b1 of the manufactured mounted structure also becomes 4 wt %. Incidentally, In content rate on the surface 109a also is equivalent to the In content rate in the position of b1.

Table 2 shows the In content rate of the solder which contacts with the position of b1 of the component electrode edge part 104a and shows occurrence or not occurrence of the crack after the heat fatigue examination in Embodiment 2.

TABLE 2

| In content rate (wt %) of the first solder material | 1 | 2 | 3 | 4 | 5 | 6 | 7 | 8 | 9 |
|---|---|---|---|---|---|---|---|---|---|
| In content rate (wt %) at the position of the component electrode edge part | 1 | 2 | 3 | 4 | 5 | 6 | 7 | 8 | 9 |
| occurrence state of crack | occur | occur | not occur | not occur | not occur | not occur | not occur | not occur | occur |

Hereinafter, the relation between the In content rate and the crack will be described paying attention to the bonding part 109 which contacts with the position of b1.

As shown table 2, when the In content rate of the solder contacting with the b1 position of the component electrode edge part 104a is 1 wt % and 2 wt %, the crack occurs.

The crack is not observed when the In content rate is 3 wt % to 8 wt %. However, the form of the solder which bonds the component electrode 104 and the substrate electrode 101 changes and the crack occurs when In content rate is 9 wt %.

It is thought that this is caused by a volume change due to a phase transformation being to occur in a solder containing In. The Sn—In system solder alloy is constituted by a β-Sn phase and a γ phase. Because the existence ratio of the β-Sn phase and the γ phase varies according to temperature even if the Sn—In system solder alloy is the same composition, a phase transformation occurs by a change of temperature. It is known that the more the In content rate is, the lower the temperature, at which the phase transformation occurs, becomes.

Therefore, in case where the In content rate is 9 wt %, it is thought that the crack occurs, because the phase transformation occurs during the heat fatigue examination and the form changes because of the difference in a volume between the β-Sn phase and the γ phase.

According to the above described results, the In content rate of the first solder material 116 is decided in a range of 3 wt % or more and 8 wt % or less. The reason why is that the bonding part 109, at the position b1 of which the In content rate is the same, can be formed by using the first solder material 116 which contains the In that exists in this range. In this case, strictly speaking, the In content rate of the solder contacting with the position of b1 of the component electrode edge part 104a becomes 3 wt % or more and 8 wt % or less.

From the result of the present embodiment, in order to reveal the reinforcement effect, it is necessary to use the solder material which contains the In of 3 wt % or more and 8 wt % or less and Sn of 88 wt % or more (97 wt % or less) to suppress the phase transformation due to containing In. In this case, the melting point of the first solder material 116 is about 210° C. to 220° C.

Since, in the heating step at the soldering process, a margin of around 20° C. is necessary in consideration of temperature unevenness in the heating step, it is necessary to set the maximum temperature at the heating to 190° C. or less.

Since it is necessary to heat up to a temperature that is higher than the melting point of the second solder material 115 by 10° C. to 20° C. in order to perform good soldering, it is necessary to use the solder material with the melting point that is 170° C. or less as a second solder material 115.

Embodiment 3

In Embodiment 3 of the present invention, a mounted structure, which is formed by changing a width of the clearance 111 to change the rate of the first solder material 116 to the sum of the first solder material 116 and the second solder material 115 in the mounted structure according to Embodiment 1, will be described.

The other constitution is similar to Embodiment 1.

A manufacturing method will be described referring to FIG. 4(a) to FIG. 8(b) which are figures showing each process of the mounted structure according to Embodiment 1.

In Embodiment 3 of the present invention, amount of supply of the first solder material 116 is changed by changing the width of the clearance 111 from 0.1 mm to 0.6 mm. The alloy composition of the first solder material 116 to use here is Sn-3.5Ag-0.5Bi-6.0In. Other manufacturing method is similar to Embodiment 1.

By the way, from the result of Embodiment 1, the solder reinforcing part 106 is defined as a part which contains In 3 wt % or more.

Table 3 shows relations of the width of the clearance 111 according to Embodiment 3, a width δ of the solder reinforcing part 106 from the position of b1 of the component electrode edge part 104a in the part (dashed line b1-b2 part in FIG. 2) where is right under the component electrode 104 in the longitudinal direction of the electronic component 103, and occurrence state of the crack.

TABLE 3

|  | width of clearance (mm) | | | | | |
| --- | --- | --- | --- | --- | --- | --- |
|  | 0.1 | 0.2 | 0.3 | 0.4 | 0.5 | 0.6 |
| Width δ of solder reinforcing part (mm) | 0 | 0.1 | 0.2 | 0.27 | 0.33 | 0.38 |
| crack | occur | not occur | not occur | not occur | not occur | not occur |
| characteristic of soldering | good | good | good | good | bad, remain in state of paste | bad, remain in state of paste |

When the width of the clearance 111 is 0.1 mm, the solder at the position of b1 in FIG. 2 does not contain In 3 wt % or more. In other words, in a dashed line b1-b2 part of FIG. 2, the solder reinforcing part 106 is not formed and the crack occurs.

When the width of the clearance 111 is 0.2 mm to 0.4 mm, the solder reinforcing part 106, which has a width in direction of the dashed line b1-b2, is formed and the occurrence of the crack is not observed.

However, when the width of the clearance 111 is 0.5 mm or 0.6 mm, after bonding by heating and cooling, the first solder material 116 does not fuse enough into the solder bonding part 105. And then, the first solder material 116 remains in the state of paste, and the good bond is not obtained.

Table 4 shows the width of the clearance 111 and the rate of the first solder material 116 to the sum of the amount of supply of the second solder material 115 and the amount of supply of the first solder material 116.

TABLE 4

|  | width of clearance (mm) | | | | | |
| --- | --- | --- | --- | --- | --- | --- |
|  | 0.1 | 0.2 | 0.3 | 0.4 | 0.5 | 0.6 |
| rate of first solder material (wt %) | 3.5 | 6.7 | 9.7 | 12.6 | 15.3 | 17.8 |

When the width of the clearance 111 is 0.1 mm, there is little amount of supply of the first solder material 116. Therefore, the amount of diffusion of In form the first solder material 116 supplied to the clearance 111 is insufficient and In does not fully diffuse to the component electrode edge part 104a, and then the solder reinforcing part 106 is formed in a part of the surface 109a. As a result, it is thought that the crack occurs since the Sn—Bi eutectic structure of the vulnerable solder bonding part 105 exists in the stress concentration portion at the time of thermal fatigue.

When the width of the clearance 111 is 0.2 mm or more, it is thought that the occurrence of the crack can be suppressed since In diffuses to the component electrode edge part 104a by the diffusion of In from the first solder material 116, and the solder reinforcing part 106 can be formed in the whole surface 109a.

The result of Embodiment 3 shows that it is desirable that the rate of the first solder material 116 to the sum of the amount of supply of the second solder material 115 and the amount of supply of the first solder material 116 be set to 6.7 wt % or more, and the solder reinforcing part 106 be formed in the whole surface 109a.

In addition, it is considered as follows that a part of the first solder material 116 remains in the state of paste in case where the width of the clearance 111 is 0.5 mm or 0.6 mm.

Since the rate of the amount of the first solder material 116 to the sum of the amount of the second solder material 115 and the amount of the first solder material 116 becomes large when the width of the clearance 111 is increased, the first solder material 116 becomes difficult to fuse into the second solder material 115 melted during heating. Therefore, it is thought that the part of the first solder material 116 remains in the state of paste since In which is contained in the first solder material 116 does not fuse into the second solder material 115 completely in the process of bonding the substrate electrode 101 and the component electrode 104 when the width of the clearance 111 is 0.5 mm or 0.6 mm. In other words, since the width of the clearance 111 is wide, the melted second solder material 115 does not reach the end portion of the inside of the first solder material 116 and thus the part remaining in the state of paste in the first solder material 116 occurs.

The result of Embodiment 3 shows that it is more desirable that the rate of the first solder material 116 to the sum of the amount of supply of the second solder material 115 and the amount of supply of the first solder material 116 be set to 12.6 wt % or less and the width 6 of the solder reinforcing part 106 of the mounted structure be set to 0.27 mm or less in order to obtain the good junction. It is desirable that the width 6 of the solder reinforcing part 106 be set to 10 μm or more. This lower limit value is prescribed because the width of one piece of the crystal of Sn is 10 μm.

By the way, in Embodiment 1, as shown in FIG. 2, the solder reinforcing part 106 is formed from the surface 109a of the bonding part 109 through the plane Q (refer to alternate long and short dash line in figure) which connects between the substrate electrode edge 101a and the component electrode edge part 104a, however, it may not be formed to the plane Q.

Figure 10:
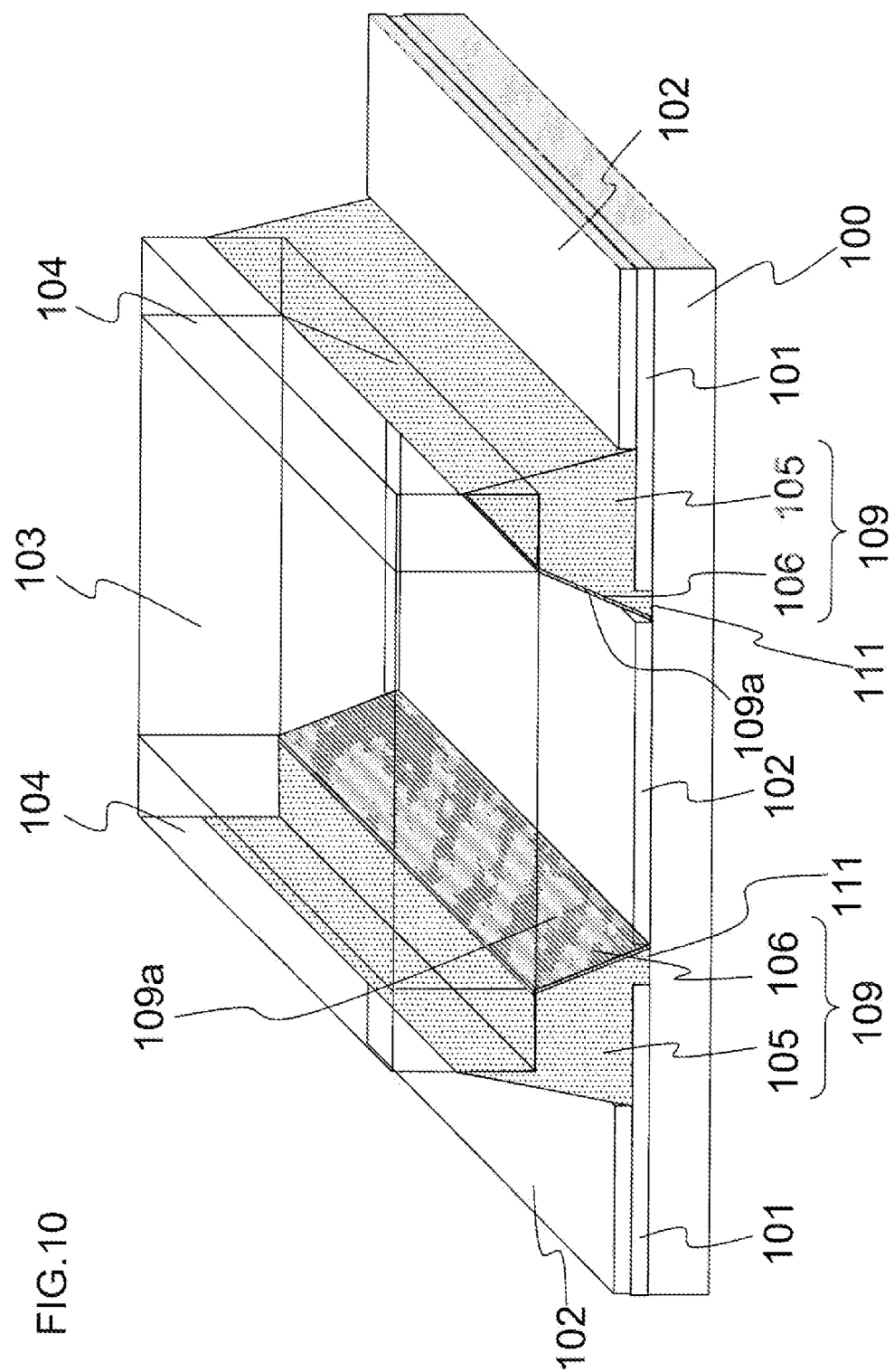
FIG. 10 is a perspective schematic view illustrating a mounted structure as a modification example according to Embodiment 1 of the present invention.

However, it is more desirable that the solder reinforcing part 106, as shown in the schematic view of FIG. 10, be formed in a state of exposing to at least the whole surface 109a.

The matter that it is more desirable that the solder reinforcing part 106 be formed in the whole surface 109a will be described below.

In case of the mounted structure 107, if the crack occurs between the bonding part 109 and the component electrode 104 or between the bonding part 109 and the substrate electrode 101, electric connection is spoiled and it becomes a problem. This crack occurs from the surface 109a and then extends to between the bonding part 109 and the component electrode edge part 104a or between the bonding part 109 and the substrate electrode edge part 101a. Therefore, it becomes possible to reduce the occurrence of the crack remarkably.

In addition, the effect of suppressing of the occurrence of the crack becomes small, however, the solder reinforcing part 106, which is in a state of exposure, may not necessarily need to be formed on the whole surface 109a. In other words, the portion where the solder reinforcing part 106 has not been formed can be allowed to exist on the surface 109a. By such a configuration, an effect of suppressing of the occurrence of the crack can appear in comparison with the case that the solder reinforcing part 106 is not formed.

Embodiment 4

Hereinafter, a mounted structure according to Embodiment 4 of the present invention will be described. The basic configuration of the mounted structure according to Embodiment 4 is the same as the Embodiment 1. However, Embodiment 4 differs from Embodiment 1 in that the clearance for supplying the first solder material 116 is not provided. In addition, there are different processes in the manufacturing method. Therefore, the difference will be mainly described.

FIG. 11(*a*) is a planar schematic view showing a mounted structure 170 according to Embodiment 4. FIG. 11(*b*) is a section schematic view illustrating a cross section between A and A in FIG. 11(*a*). As shown in FIGS. 11(*a*) and 11(*b*), in the mounted structure 170 of Embodiment 4, unlike the mounted structure 107 of Embodiment 1, the clearance 111 is not provided.

Next, a manufacturing method of the mounted structure 170 according Embodiment 4 will be described.

FIGS. 12(*a*) to 15(*b*) are schematic views for describing a manufacturing method of a mounted structure 170 according to Embodiment 4. Incidentally, in each figure of FIGS. 12(*a*), 13(*a*), 14(*a*) and 15(*a*), a planar schematic view is shown, and in each figure of FIGS. 12(*b*), 13(*b*), 14(*b*) and 15(*b*), a sectional schematic view illustrating a cross section between A and A in the planar schematic view. In addition, an enlarged view illustrating S part is also shown as FIG. 14(*c*).

As shown in FIGS. 12(*a*) and 12(*b*), the substrate electrode edge part 101*a* adjoins the resist 102 provided below the position on which the electronic component 103 of the substrate electrode 101 is mounted, and the clearance of Embodiment 1 is not formed.

And as shown in FIGS. 13(*a*) and 13(*b*), the second solder material 115 is supplied on the substrate electrode 101 exposed at a predetermined interval from the substrate electrode edge part 101*a*. This supply of the second solder material 115 corresponds to one example of a second solder material supply step of the present invention.

Figure 14:
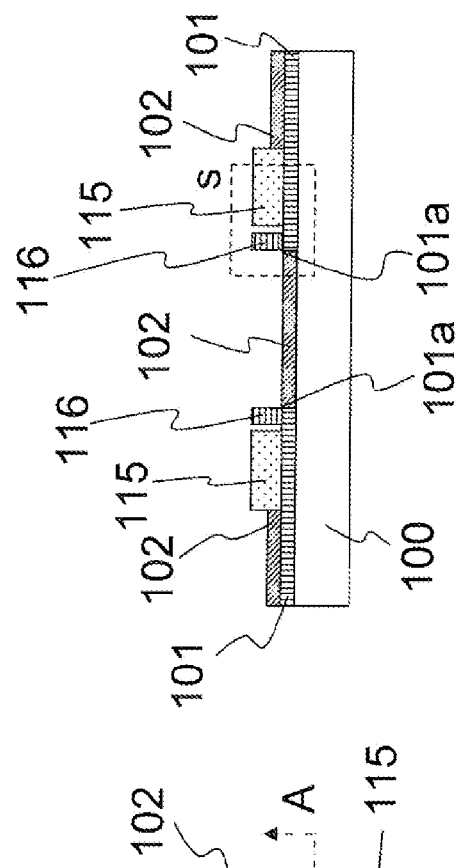
FIG. 14(a) is a view for describing a manufacturing method of a mounted structure according to Embodiment 4 of the present invention.
FIG. 14(b) is a sectional schematic view illustrating a cross section between A and A in FIG. 14(a)
FIG. 14(c) is an enlarged view illustrating S part of FIG. 14(b)
Figure 14:
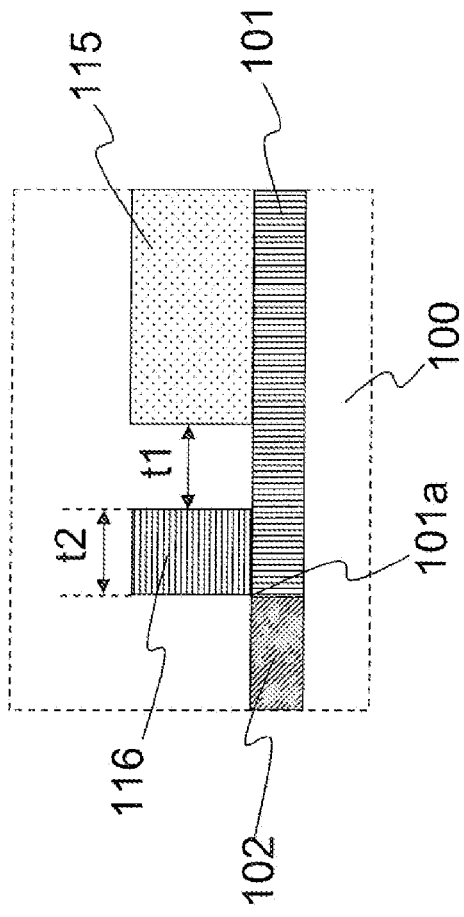
Figure 14:
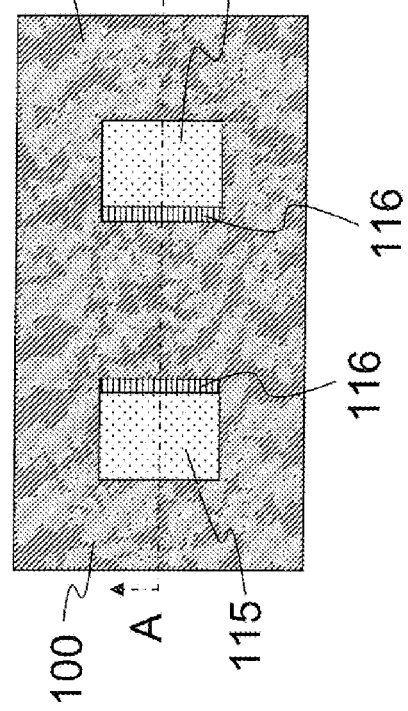

Next, as shown in FIGS. 14(*a*) and 14(*b*), the first solder material 116 is supplied on the substrate electrode 101, which has the predetermined interval from the substrate electrode edge part 101*a*, at an interval from the second solder material 115

Next, the interval provided between the first solder material 116 and the second solder material 115 will be described.

In the case of the present invention, if the first solder material 116 and the second solder material 115 are crushed and mixed when the electronic component 103 is mounted, the second solder material 115 moves to the surface 109*a* side and the solder reinforcing part 106 may not be formed in a state of exposing in a part of the surface 109*a* after the heating step. Since it is more desirable that the solder reinforcing part 106 be formed in a state of exposing in the whole surface 109*a*, it is necessary to prevent the first solder material 116 and the second solder material 115 from being crushed and being mixed when the electronic component 103 is mounted. Thus, when the width of the crushed solder is taken into consideration, it is desirable that the interval of 0.1 mm or more be provided between the first solder material 116 and the second solder material 115.

On the other hand, in the heating step, when the heated second solder material 115 is melted and is wetly spread to the substrate electrode 101, it is necessary that the second solder material 115 touches the first solder material 116. Since the second solder material 115 is wetly spread to about 0.3 mm, it is desirable that the interval between the first solder material 116 and the second solder material 115 be set to 0.3 mm or less.

Therefore, an interval t1 (refer to the enlarged view of S part in FIG. 14(*c*)) between the position where the first solder material 116 is supplied and the position where the second solder material 115 is set to 0.1 mm or more and 0.3 mm or less.

In other words, as shown in FIG. 14(*c*), the second solder material 115 is supplied to the position which separates the distance, that has a width t2 of the region where the first solder material 116 is supplied and the above described interval t1, from the substrate electrode edge part 101*a*.

Then, as shown in FIGS. 15(*a*) and 15(*b*), the electronic component 103 is mounted on the substrate 100 so that the component electrode 104 is arranged on the second solder material 115.

Then, in a state where the electronic component 103 is mounted on the substrate 100, the second solder material 115 is melted by heating, cooling is performed, and the mounted structure 170 (refer to FIG. 11(*b*)) is manufactured.

As in the mounted structure 170 of Embodiment 4 mentioned above, the solder reinforcing part 106 can be formed when the clearance is not provided, and a heat resistance fatigue characteristic can be improved.

As mentioned above, in the mounted structure which bonds an electronic component to the substrate with Sn—Bi system solder, the strength of the alloy at the stress concentration portion under the electronic component, which becomes a starting point of the crack that occurs when thermal fatigue is loaded, becomes high as compared with Sn—Bi by In solid-solution-strengthen in which some Sn atoms of a crystalline lattice are replaced by In, so the occurrence of the crack can be suppressed.

Figure 16:
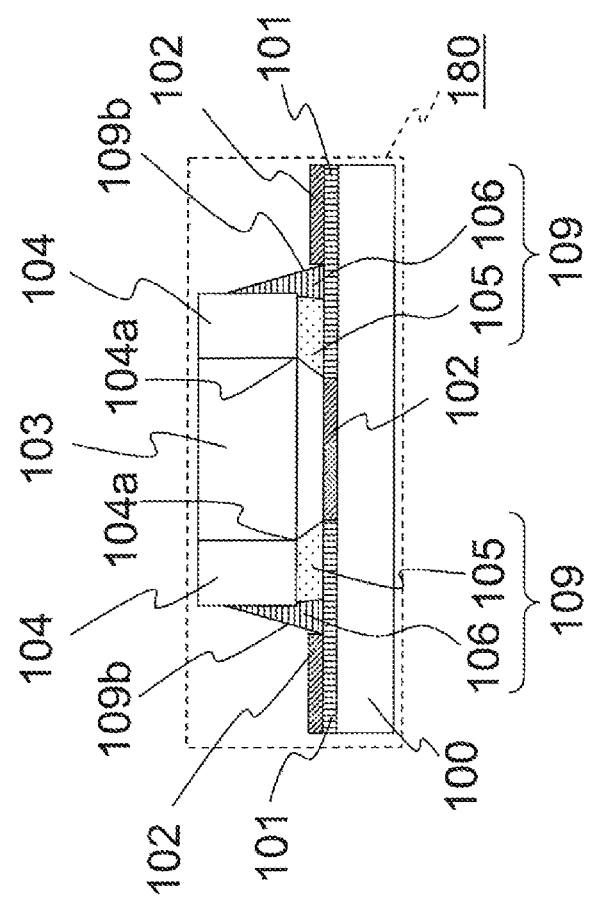
FIG. 16 is a side sectional schematic view showing a mounted structure as a modification example according to Embodiment 4 of the present invention.
Figure 17:
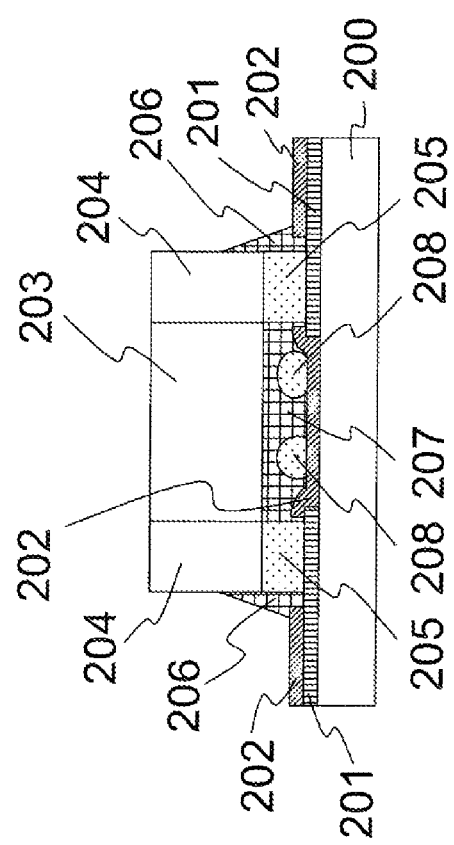
FIG. 17 is a side sectional schematic view showing a conventional mounted structure.

By the way, in the above described embodiment, the solder reinforcing part 106 containing In of 3 wt % or more and 8 wt % or less is formed on the surface 109*a* of the inner side of the bonding part 109. However, not limited to this, for example, the solder reinforcing part 106 may be formed in a position as shown in FIG. 16. FIG. 16 is a side configuration view of a mounted structure 180. In the mounting structure 180 shown in FIG. 16, the solder reinforcing part 106 containing In is formed on an outside surface 109*b* of the bonding part 109 with reference to the electronic component 103.

As described above, it can be allowed that the solder reinforcing part 106 is formed on the outside surface 109*b* side. In the case of this, since the crack tends to occur from the inner side surface 109*a*, it is thought that heat-resistant fatigue characteristic is a little inferior to the mounted structure 107 and the mounted structure 170, however, the heat-resistant fatigue characteristic can be improved as compared with the conventional configuration.

Therefore, unlike the case of the reinforcement with the resin at the solder bonding part 105, since there is hardly the difference between the coefficient of linear expansion of the solder bonding part 105 and the coefficient of linear expansion of the solder reinforcing part 106, the heat-resistant fatigue characteristic is able to be improved.

In this case, one example of a side vicinity part of the bonding part of the present invention corresponds to the surface 109*b* of FIG. 16.

By the way, in the present embodiment, Sn-3.5Ag-0.5Bi—XIn ($3<=X<=8$) is used as the first solder material 116, however, the present invention is not limited to this. The first solder material may be solder that contains In of 3 wt % or more and 8 wt % or less and Sn of 88 wt % or more (97 wt % or less), for instance, solder alloy such as Sn-6In and Sn-8In, as long as the reinforcement effect due to In is evolved and the phase transformation into γ-Sn is suppressed.

In addition, in the present embodiment, the first solder material 116 is supplied by screen-stencil, however, the present invention is not limited to this. That is, for instance, the first solder material 116 may be supplied by plating.

In addition, in the present embodiment, the solder of alloy composition Sn-58Bi is used as the second solder material 115, however, the present invention is not limited to this. Since the manufacturing method of the mounted structure of the present invention can be applied, as long as the second solder material is the Sn—Bi system solder having the low melting point which is 170° C. or less, for instance, the solder alloy such as Sn-57Bi-1Ag and Sn-40Bi-0.1Cu, which contains a little Ag and Cu, may be used.

In addition, in the present embodiment, the chip capacitor of 3216 sizes is used as the electronic component 103, however, the present invention is not limited to this. That is, the size or kind of the electronic component 103 may differ from the above described one, and the shape of the component electrode 104 may be lead shape.

In addition, in the above described embodiment, each of the substrate electrode 101, the component electrode 104 and the bonding part 109 comprises a pair, however, the present invention is not limited to a pair. That is, as for the bonding part 109, it may be formed one, three or more.

INDUSTRIAL APPLICABILITY

The mounted structure and the method for manufacturing the same of the present invention have an effect that the improvement of heat-resistant fatigue characteristic and are useful as, for instance, a mounted structure manufactured by SMT method, a method for manufacturing the same, and the like.

DESCRIPTION OF SYMBOLS 100 substrate
101 substrate electrode
101*a* substrate electrode edge part
102 resist
103 electronic component
104 component electrode
104*a* component electrode edge part
105 solder bonding part
106 solder reinforcing part
107 mounted structure
111 clearance
115 second solder material
116 first solder material
200 substrate
201 substrate electrode
202 resist
203 electronic component
204 component electrode
205 solder bonding part
206 adhesion reinforcing part
207 adhesion reinforcing part
208 solder part

What is claimed is:
1. A mounted structure comprising:
a substrate having a substrate electrode;
an electronic component having a component electrode; and
a bonding part bonding the substrate electrode and the component electrode, wherein
the bonding part is constituted by a solder reinforcing part and a solder bonding part;

the solder reinforcing part is a side vicinity part of the bonding part, and is constituted by In of 3 wt % or more and 8 wt % or less and Sn of 88 wt % or more, and
the solder bonding part is constituted by a Sn—Bi system solder material and In of 0 wt % or more and less than 3 wt %.

2. The mounted structure according to claim 1, wherein the solder reinforcing part is formed by a thickness of 10 μm or more and 0.27 mm or less with reference to direction from the side surface to an inner part.

3. A manufacturing method of a mounted structure comprising:
supplying a first solder material on a substrate electrode of a substrate or to a neighborhood of the substrate electrode;
supplying a second solder material on the substrate electrode;
disposing a component electrode of an electronic component on the second solder material to mount the electronic component on the substrate;
heating the first solder material and the second solder material at a temperature of a melting point of the second solder material or more and less than a melting point of the first solder material; and
cooling the first solder material and the second solder material after the heating, wherein
the first solder material and the second solder material are mutually close due to the supplying of the first solder material and the second solder material,
the second solder material is a Sn—Bi system solder material that does not contain In,
the first solder material is a material that contains In of 3 wt % or more and 8 wt % or less and Sn of 88 wt % or more,
In of the first solder material fuses into the second solder material which has been melted by the heating, and then, when a bonding part, which bonds between the substrate electrode and the component electrode, is formed by the cooling, i) a part included in the bonding part, into which In fuses and is constituted by In of 3 wt % or more and 8 wt % or less and Sn of 88 wt % or more, is formed on a side vicinity part of the bonding part as a solder reinforcing part, and ii) a part, which is included in the bonding part except for the solder reinforcing part and is constituted by a Sn—Bi system solder material and In of 0 wt % or more and less than 3 wt %, is formed as a solder bonding part.

4. The manufacturing method of a mounted structure according to claim 3, wherein
the substrate has a pair of the substrate electrodes,
the electronic component has a pair of the component electrodes,
the bonding parts are formed between the pair of the substrate electrodes and the pair of the component electrodes which are corresponding to the pair of the substrate electrodes, respectively, and
the solder reinforcing parts are formed on whole side surfaces of the bonding parts respectively, the side surfaces facing each other.

5. The manufacturing method of a mounted structure according to claim 3, wherein
the solder reinforcing part is formed by a thickness of 10 μm or more and 0.27 mm or less with reference to direction from the side surface to an inner part.

6. The manufacturing method of a mounted structure according to claim 3, wherein
the first solder material is a Sn—Ag—Bi—In system solder material.

7. A manufacturing method of a mounted structure comprising:

supplying Sn-3.5Ag-0.5Bi-6In as a first solder material on a substrate electrode of a substrate or to a neighborhood of the substrate electrode;

supplying Sn-58Bi as a second solder material on the substrate electrode;

disposing a component electrode of an electronic component on the second solder material to mount the electronic component on the substrate;

heating the first solder material and the second solder material at a temperature of a melting point of the second solder material or more and less than a melting point of the first solder material; and cooling the first solder material and the second solder material after the heating, wherein the first solder material and the second solder material are mutually close due to the supplying of the first solder material and the second solder material, In of the first solder material fuses into the second solder material which has been melted by the heating, and then, when a bonding part, which performs bond between the substrate electrode and the component electrode, is formed by the cooling, i) a part included in the bonding part, into which In fuses and is constituted by In of 3 wt % or more and 8 wt % or less and Sn of 88 wt % or more, is formed on a side vicinity part of the bonding part as a solder reinforcing part, and ii) a part, which is included in the bonding part except for the solder reinforcing part and is constituted by a Sn—Bi system solder material and In of 0 wt % or more and less than 3 wt %, is formed as a solder bonding part.

\* \* \* \* \*